(12) United States Patent
Biber et al.

(10) Patent No.: US 8,487,619 B2
(45) Date of Patent: Jul. 16, 2013

(54) ADAPTER TO CONNECT A LOCAL COIL IN A MAGNETIC RESONANCE SYSTEM

(75) Inventors: Stephan Biber, Erlangen/Frauenaurach (DE); Yvonne Candidus, Tuchenbach (DE); Daniel Driemel, Oederan (DE); Helmut Greim, Adelsdorf (DE); Thomas Kundner, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 590 days.

(21) Appl. No.: 12/759,883

(22) Filed: Apr. 14, 2010

(65) Prior Publication Data
US 2010/0271027 A1  Oct. 28, 2010

(30) Foreign Application Priority Data

Apr. 23, 2009 (DE) .................. 10 2009 018 608

(51) Int. Cl.
*G01R 33/20* (2006.01)
*G01R 33/02* (2006.01)

(52) U.S. Cl.
USPC ............ 324/318; 324/307; 324/322; 600/415

(58) Field of Classification Search
USPC .................... 324/300–322; 600/407–465
See application file for complete search history.

(56) References Cited

U.S. PATENT DOCUMENTS

| | | | |
|---|---|---|---|
| 5,807,253 A | 9/1998 | Dumoulin et al. | |
| 6,943,551 B2 | 9/2005 | Eberler et al. | |
| 7,345,485 B2 * | 3/2008 | Jevtic et al. | 324/322 |
| 7,609,063 B2 * | 10/2009 | Xue et al. | 324/318 |
| 2007/0016003 A1 | 1/2007 | Piron et al. | |
| 2007/0282192 A1 | 12/2007 | Rezzonico et al. | |
| 2009/0216110 A1 * | 8/2009 | Piron et al. | 600/415 |

* cited by examiner

*Primary Examiner* — Melissa Koval
*Assistant Examiner* — Emily Chan
(74) *Attorney, Agent, or Firm* — Schiff Hardin LLP

(57) ABSTRACT

A simple connection of a coil with a magnetic resonance tomography (MRT) is facilitated by a method and an adapter wherein a coil-connection element of at least one local coil is connected with an MRT-connection element of an MRT system. The adapter has a coil-connection element adapter designed to form a connection with at least one coil-connection element of at least one local coil. The adapter also has at least one MRT-connection element adapter designed to form a connection with an MRT-connection element of an MRT system. The adapter can be fixed mechanically to a fixing element of the MRT system.

17 Claims, 9 Drawing Sheets

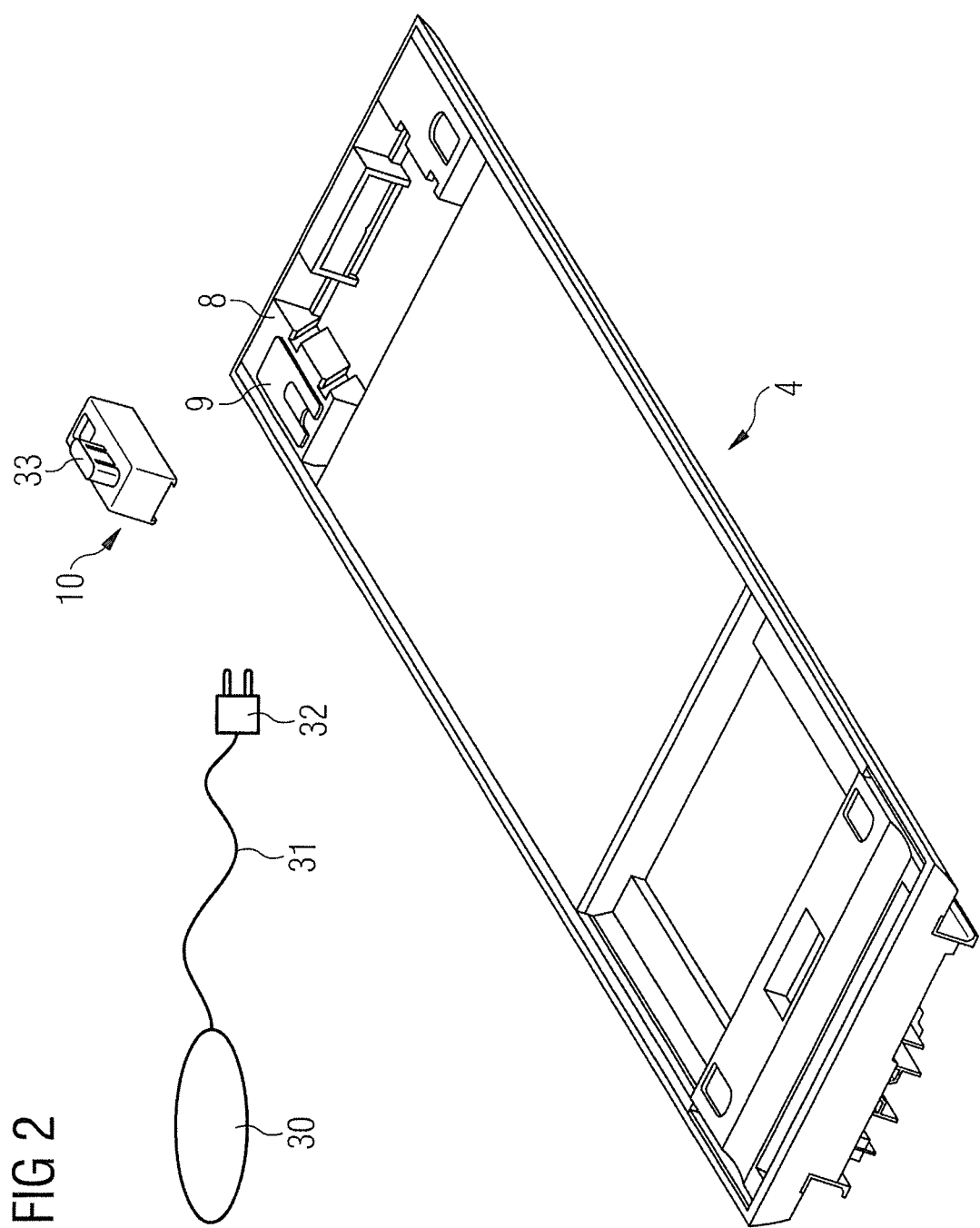

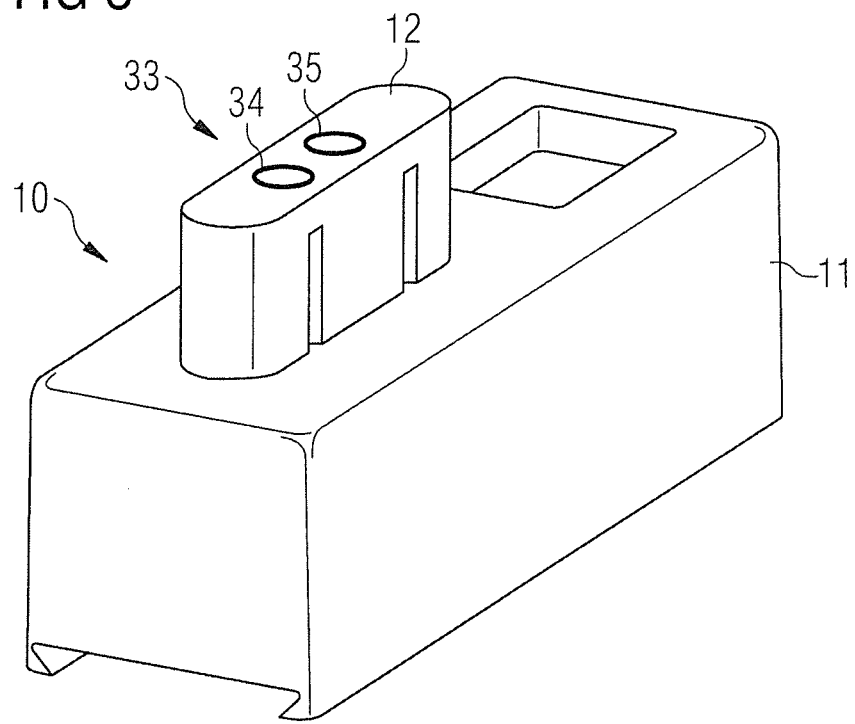
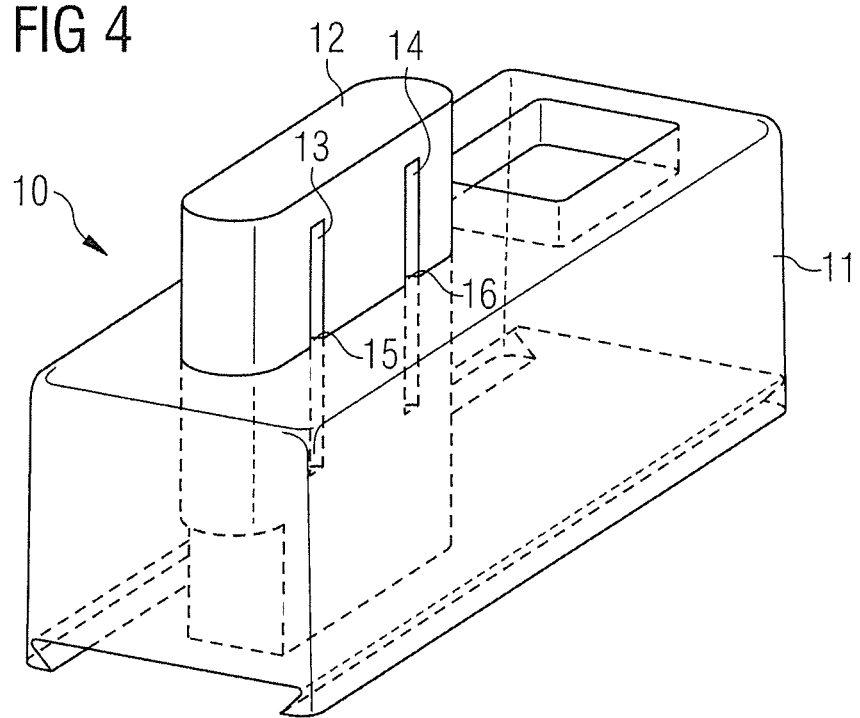

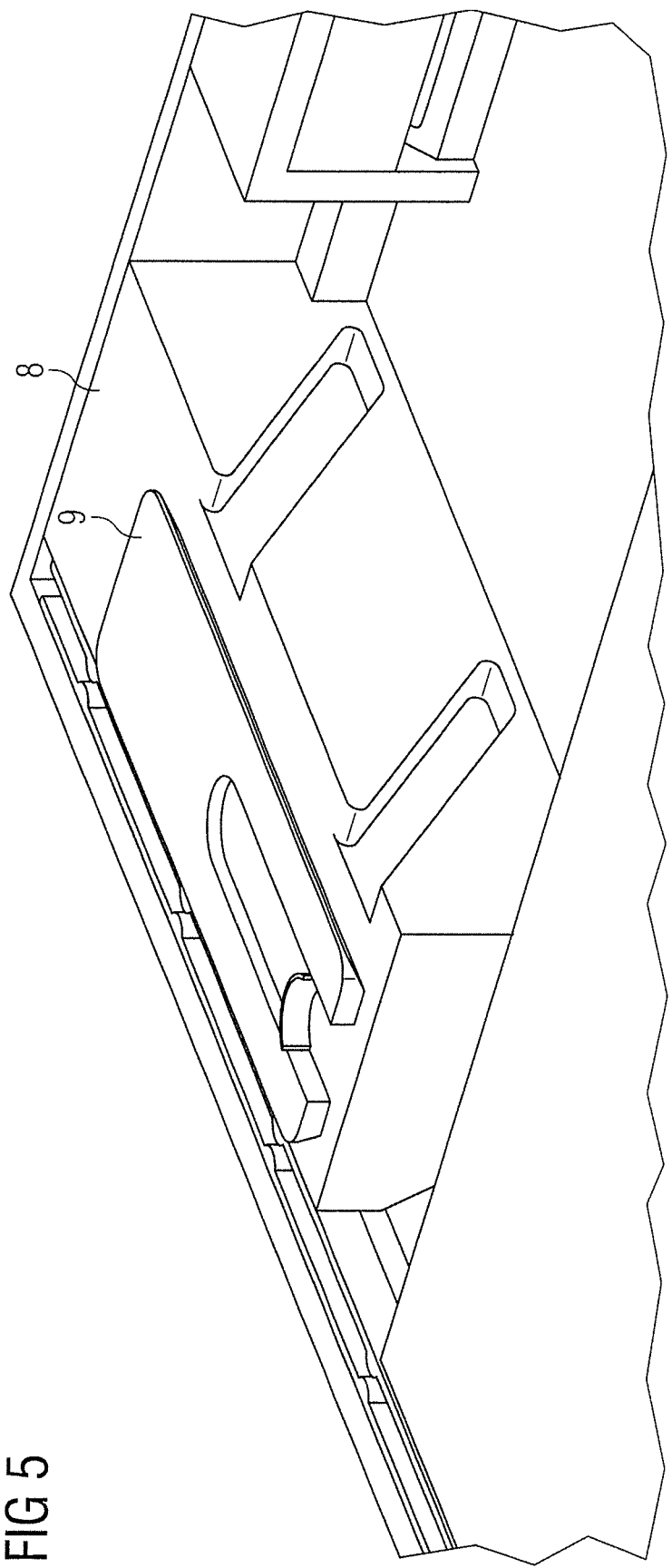

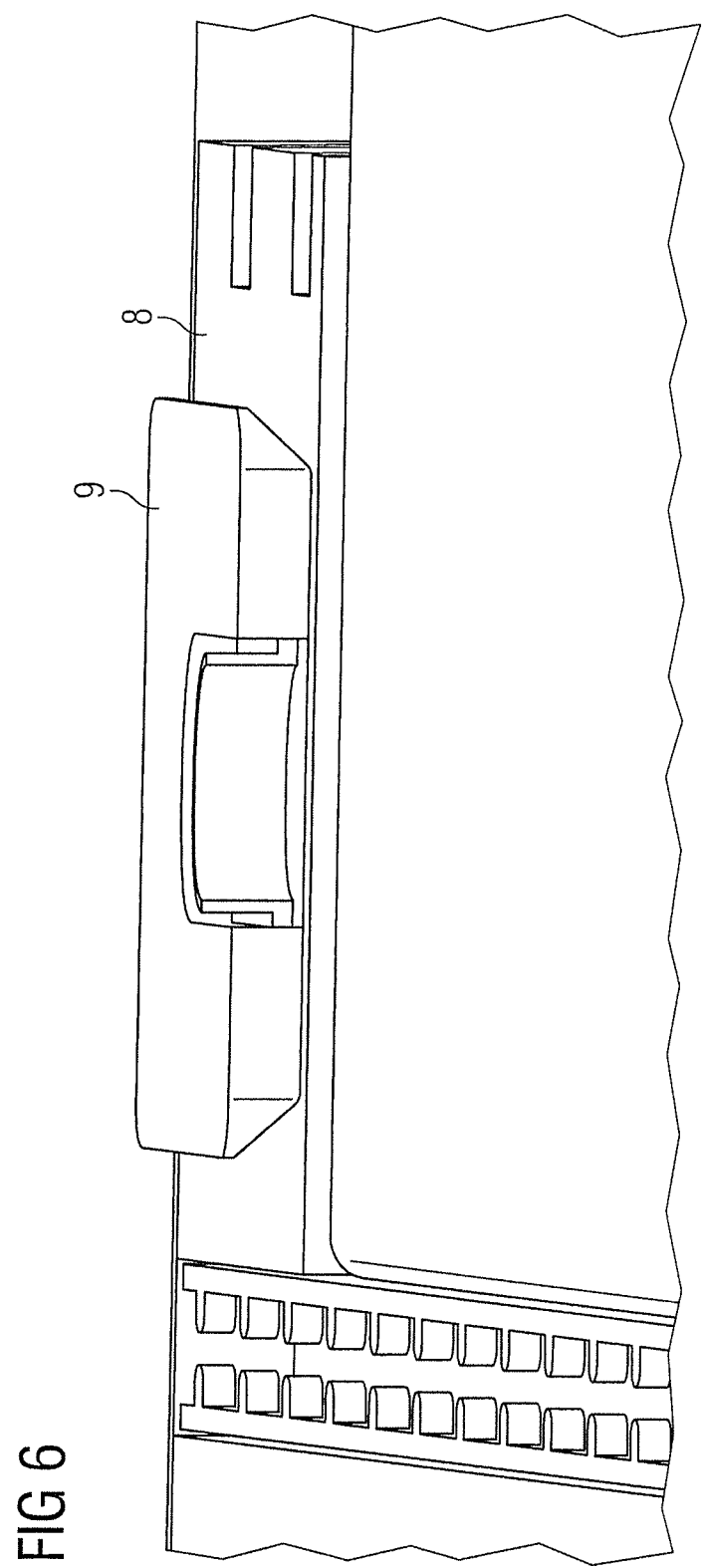

FIG 10
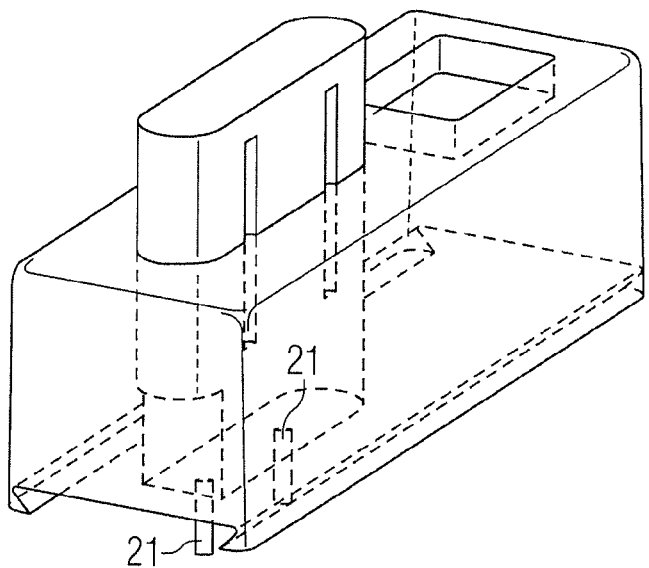
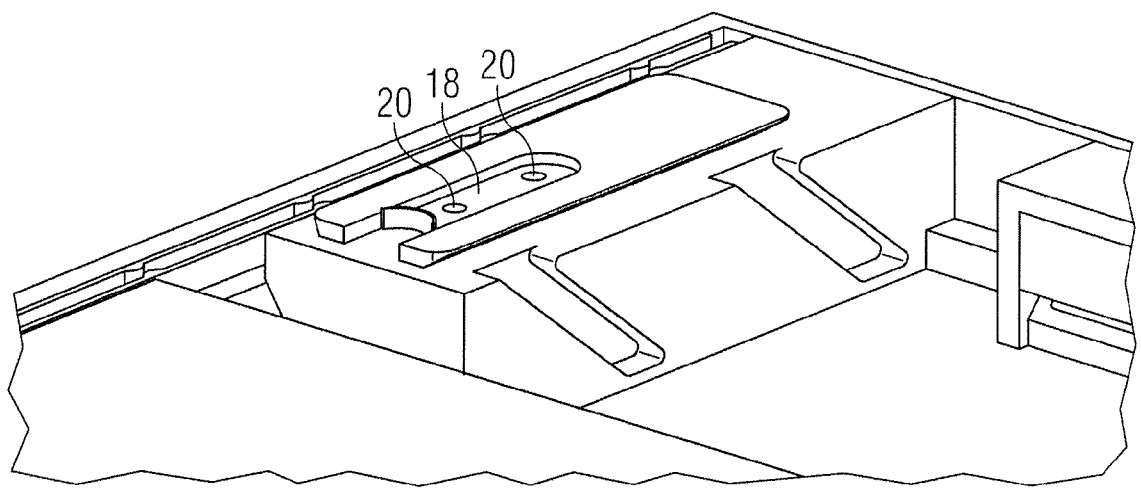

ADAPTER TO CONNECT A LOCAL COIL IN A MAGNETIC RESONANCE SYSTEM

BACKGROUND OF THE INVENTION

1. Field of the Invention

The present invention concerns adapters and methods to connect a connecting plug of at least one local coil with a connecting socket located at a magnetic resonance imaging system.

2. Description of the Prior Art

Magnetic resonance apparatuses for the purpose of examining especially patients by magnetic resonance imaging are known, for example, from DE10314215B4.

Magnetic resonance systems operate with coils to transmit high frequency pulses for exciting nuclear spins so as to emit magnetic resonance signals and/or receiving the induced magnetic resonance signals. Typically, a magnetic resonance system has a large so-called whole-body coil (BC), which is usually permanently mounted in the apparatus, as well as several small local coils (also called surface coils or LC).

In current MR imaging (also called magnetic resonance tomography), images with high signal-to-noise ratio are usually obtained with so-called local coils (loops).

In the process, the excited nuclei in the coil induce a voltage that is amplified with a low noise preamplifier (LNA) tuned to the MR frequency, and is transmitted to the receiving electronics. In order to improve the signal-to-noise ratio even in the case of high resolution images, so-called high field systems are used. Currently, their basic field strength is at 3 Tesla and higher. Since it is desirable to connect a number of coil elements (loops) to an MR receiving system that is larger than the number of receivers available, a switching matrix (here called a RCCS) is mounted between the receiving channels and the receivers. The switching matrix routes the currently active reception channels to the available receivers. In this way, it is possible to connect a number of coil elements that exceed the number of receivers available, because in a whole-body coverage only the coils that are in the field of view (FoV) or in the homogeneity volume of the basic field magnet have to be read.

Herein, the individual antenna elements are also denoted as coil elements. A "coil" is an antenna that can include one or several coil elements (array coil). A coil is composed of the coil elements (resonators), the preamplifier, additional electronics and wiring, the housing and in most cases a cable and plug by means of which it is connected to the "system." The "system" is defined as the MR system.

In developing a new generation of MRI scanners, it is advantageous to be able to use also local coils from previous systems for the apparatuses of the new generation.

One way to address this problem is to provide the new apparatus with an interface for the old apparatus. Another known approach is to provide an interface box having a plug with an old interface, a cable and an electronic box with the new interface. In this case, the electronic box rests, for example, on the patient and the box has no fixed position or local transmission coils. If the box is not protected, it is possible that power from the local transmission coil is coupled into the electronics/wiring within the electronic box and, because of the different mechanical position of the electronic box in relation to the transmission coil, this can result in uncontrolled couplings, which can have an effect on the picture quality and can even contribute to defects of other components (preamplifier).

If the box is connected to the system by means of a flexible cable and the box does not rest on the table but, instead, hangs down at the side of the table, components at the box/cable/plug/table can be destroyed when the table is moved into the bore (examination room inside the MRT).

SUMMARY OF THE INVENTION

An object of the invention to optimize the connection of a connecting plug element of at least one local coil with a connecting socket of a magnetic resonance imaging system.

The above object is achieved in accordance with the invention by an adapter to connect a coil-connection element of at least one local coil with an MRT-connection element of an MRT system, wherein the adapter has a coil-connection element adapter designed to form a connection with at least one coil-connection element of at least one local coil. The adapter has also at least one MRT-connection element adapter designed to form a connection with an MRT-connection element of the MRT system. The adapter can be mechanically fixed to a fixing element of the MRT system.

The invention also encompasses a method to connect a coil-connection element of at least one local coil with an MRT-connection element of a magnetic resonance imaging system that includes the steps of inserting a coil-connection element of a local coil into a coil-connection element adapter of an adapter, moving the adapter into a position in which an MRT-connection element adapter contained in the adapter is located opposite an MRT-connection element arranged at a patient table of an MRT system, and inserting an MRT-connection element adapter of the adapter into an MRT-connection element of the MRT system.

As used herein, the coil-connection element can be, for example, a plug or a socket or anything forming a (conductive) connection to the local coil by means of a form-fit or other type of engaging plug-in connection, or any other mechanically fixed connection, with a socket or a plug, etc., of the MRT system (in particular at the patient table).

An MRT-connection element as used herein can be, for example, a socket or a plug or anything forming a (conductive) connection to the MRT system that can be connected by means of a form-fit or other type of engaging plug-in connection, or any other mechanically fixed connection, with a socket or a plug, etc., of a local coil or an adapter.

The MRT-connection element adapted of the adapter can be, for example, anything that can be plugged into or otherwise connected to an MRT-connection element of the MRT system. For example, it can be configured and designed for an MRT-connection element of an MRT system and can possibly be exchanged with an MRT-connection element adapter of any other MRT system.

An element of the magnetic resonance imaging system for the purpose of fixing the adapter can be, for example, a guide rail at a patient table of the magnetic resonance imaging system or any other element that is appropriate to fix the adapter, for example, in two or three directions of a Cartesian coordinate system.

In particular, the adapter can include a rail and/or trapezoidal guide by means of which a form-fit connection can be made with a rail and/or trapezoidal guide at the patient table of the magnetic resonance imaging system. As a result, the adapter can be moved in a particular direction until an MRT-connection element adapter of the adapter is located at/above an MRT-connection element at the patient table and can be inserted into that element to form an electrical and mechanical connection.

BRIEF DESCRIPTION OF THE DRAWINGS

FIG. 2 shows a patient table with a trapezoidal rail guide (for an adapter that is also shown) and an MRT-connection element.

FIG. 3 is a three-dimensional representation of an adapter.

FIG. 4 shows the three-dimensional representation of the adapter of FIG. 3, in phantom.

FIG. 5 shows an MRT-connection element with a trapezoidal rail guide.

FIG. 6 shows an MRT-connection element with a trapezoidal rail guide viewed from a different angle.

FIG. 10 shows an MRT-connection-element and an adapter, wherein an example (simplified and enlarged for good visibility) of sockets and plugs is represented at the MRT-connection element and the adapter.

DESCRIPTION OF THE PREFERRED EMBODIMENTS

Figure 1:
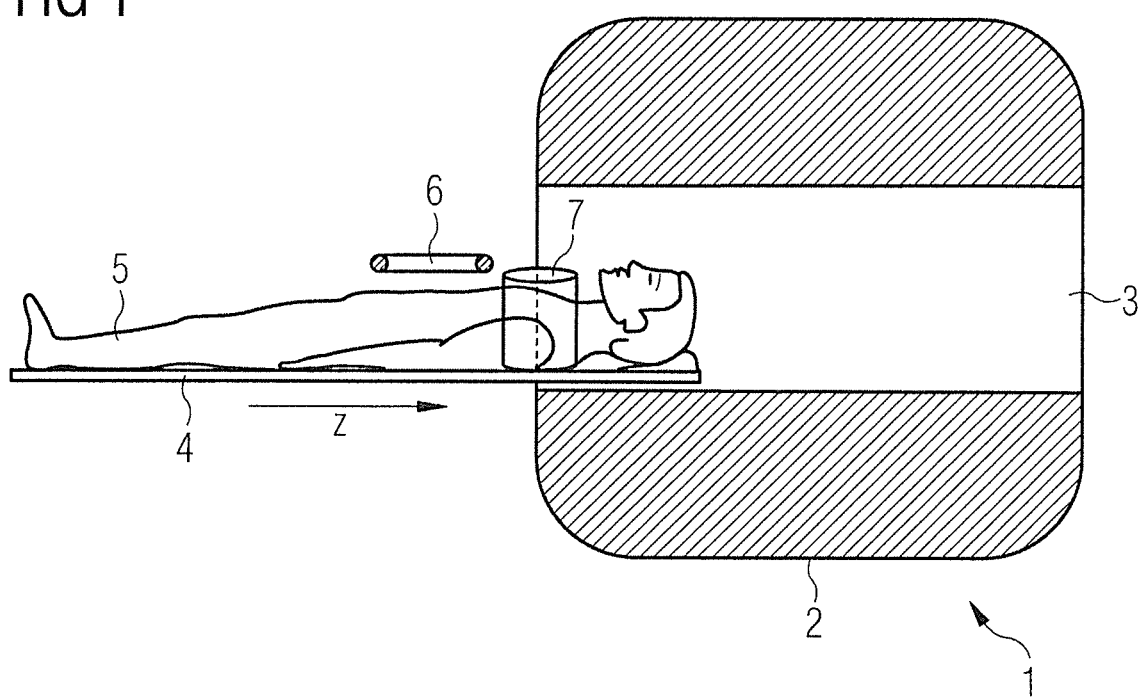
FIG. 1 illustrates a magnetic resonance apparatus.

FIG. 1 shows a magnetic resonance apparatus 1 with a whole-body coil 2 and a tubular room 3, into which a patient table 4 with, for example, a patient 5 and local coils 6, 7 can be moved, in order to generate images of the patient 5 which can be further processed.

FIG. 2 shows a patient table 4 with an MRT-connection element 8 with a (in cross-section approximately) trapezoidal rail guide 9 for an adapter 10 (also shown), as well as a coil 30, which is connected via a cable 31 with a coil-connection element 32. The coil-connection element 32 can be connected with a coil-connection element adapter 33 at the adapter 10 (for example, by insertion).

FIG. 3 shows a three-dimensional representation of an adapter that has a housing 11 that can be moved in the trapezoidal rail guide (9 in FIG. 2). In the housing 11 of the adapter 10, an MRT-connection element 12 adapter (in a tongue and groove guide rail) can be moved. In FIG. 3, this movement is downward (negative z-direction, "–z") in the direction of an MRT-connection element (not shown but designated in FIG. 3 but designated 8 at the patient table in FIG. 2). In the coil-connection element adapter 33 of the adapter 10, two coil-connection element sockets 34, 35 (roughly simplified and enlarged for good visibility) are shown in an exemplary manner.

FIG. 4 shows a three-dimensional phantom representation of an adapter 10. The adapter 10 has a housing 11 that can be moved in a trapezoidal rail guide 9. In the housing 11 of the adapter 10, an MRT-connection element adapter 12 has longitudinal grooves 13, 14, allowing it to be moved in engagement elements 15, 16 of the housing 11.

FIG. 5 shows an MRT-connection element 8 with a trapezoidal rail guide 9.

FIG. 6 shows a different view of an MRT-connection element 8 with a trapezoidal rail guide 9, which illustrates the trapezoidal shape of the trapezoidal rail guide 9 in cross-section.

Figure 7:
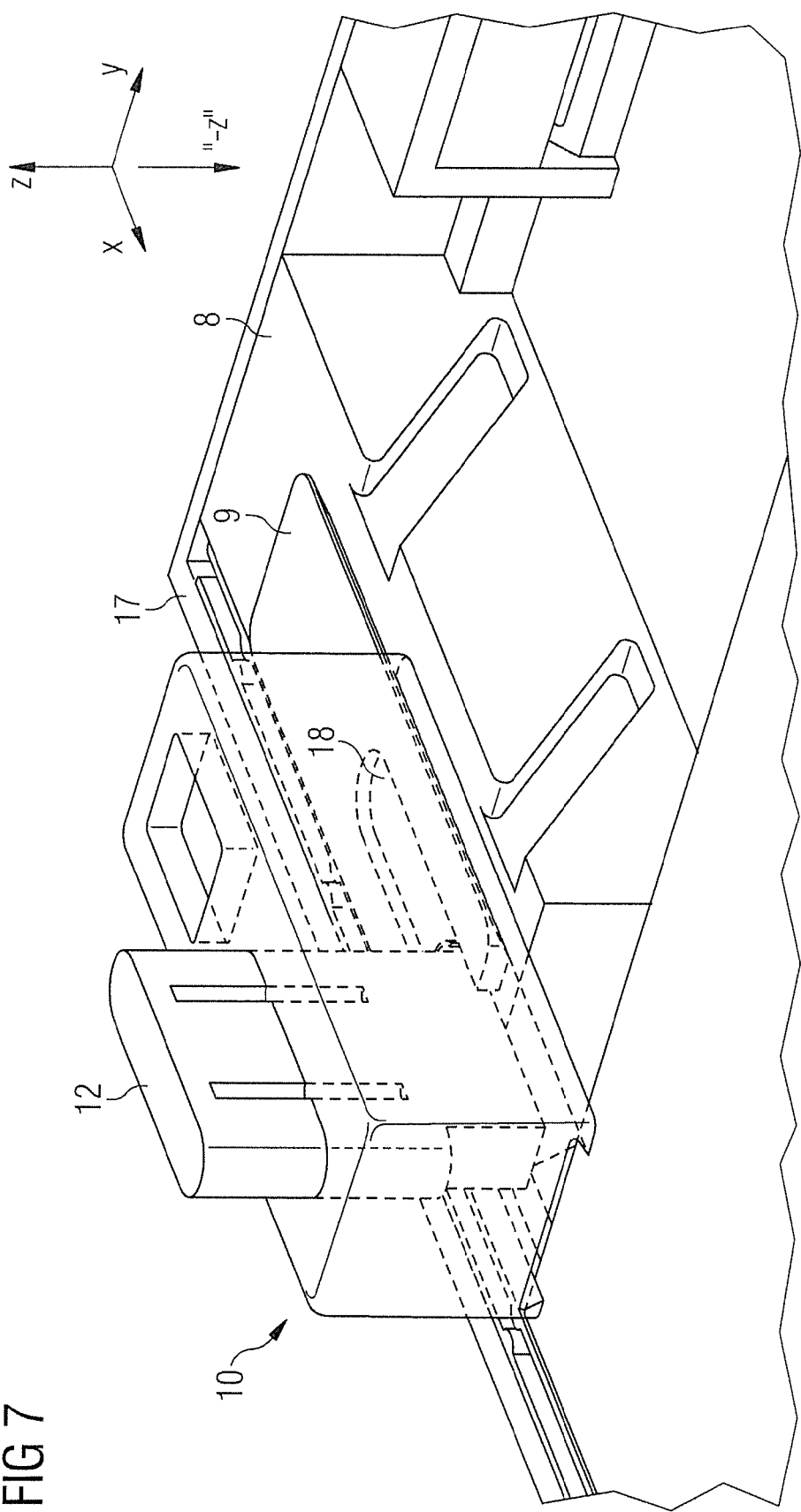
FIG. 7 shows an MRT-connection element with a trapezoidal rail guide on top of which an adapter can be moved.

FIG. 7 shows a Cartesian x/y/z coordinate system, the direction"–z", and an MRT-connection element 8 with a trapezoidal rail guide 9 on top of which an adapter 10 (17 is the edge of the patient table) can be moved. The MRT-connection element adapter 12 in the form of a movable plug-in element (in the housing of the adapter 10) can be connected with the MRT-connection element 8 (for example, its sockets) in an electrically conductive manner by movement in the "–z" direction in the direction of the area 18 of the MRT-connection element 8 of the patient table having contacts, and can be mechanically fixed (for example, inserted), such as by a form-fit manner.

Figure 8:
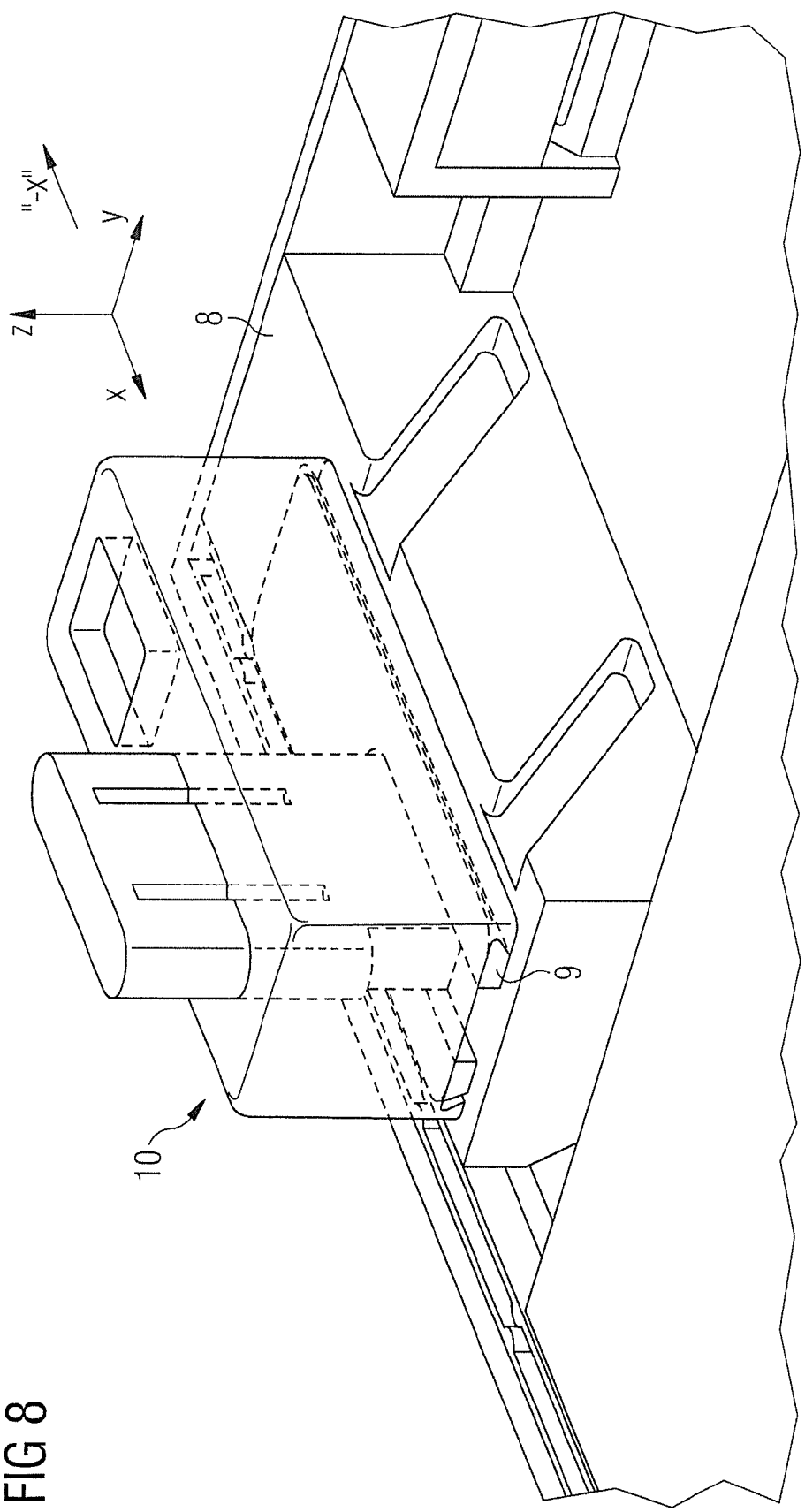
FIG. 8 shows an MRT-connection element with a trapezoidal rail guide on top of which an adapter can be moved and in which, compared to FIG. 7, the adapter has been moved in the trapezoidal rail guide to the right.

FIG. 8 shows an MRT-connection element 8 with a trapezoidal rail guide 9 and an adapter 10 that can be moved on top of this guide 9. The adapter 10, compared to FIG. 7, has been moved to the right (arrow "–z") in the trapezoidal rail guide 9.

Figure 9:
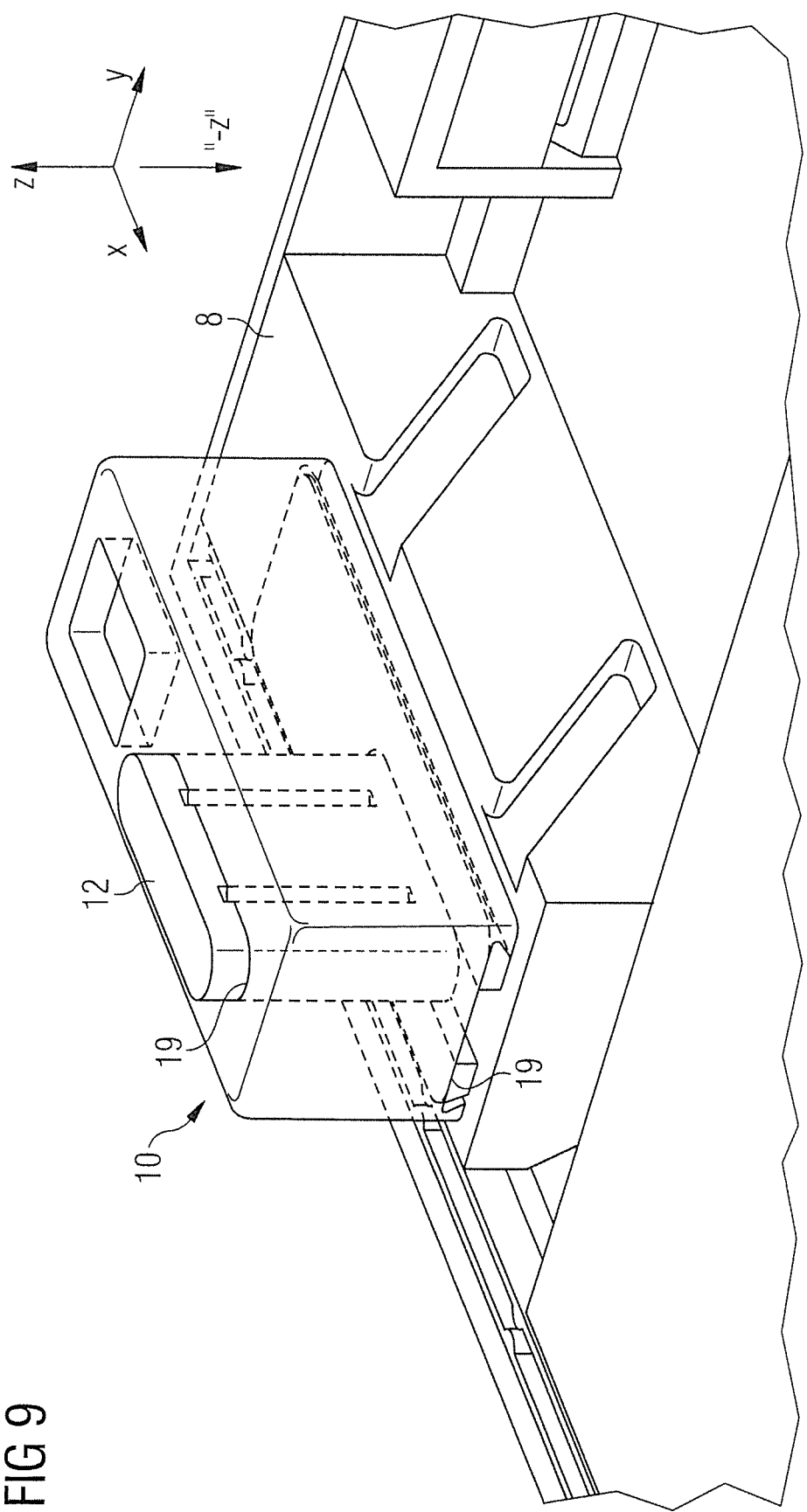
FIG. 9 shows an MRT-connection element on top of which the adapter has been moved and in which, compared to FIG. 7, an MRT-connection element adapter of the adapter has been moved downwardly in the direction of the MRT-connection-element and fully inserted for an electrical connection with the adapter.

FIG. 9 shows an MRT-connection element 8 on top of which an adapter 10 has been moved and in which, compared to FIG. 7, the MRT-connection element adapter 12 of the adapter 10 has been moved to a limit stop 19 (in the form of steps) and downward (direction "–z") in the direction of the contact-area of the MRT-connection element 8 to form an electrical connection with the adapter 10.

FIG. 10 shows an MRT-connection element 8 and an adapter 10 in which, in an exemplary manner (simplified and enlarged for good visibility), sockets 20 are represented at the contact area 18 of the MRT-connection element 8 and plugs 21 at the adapter 10. For clarity, such plugs and sockets have not been shown in FIGS. 1-9.

The mechanical construction of the adapter (interface) in accordance with the invention, which can be or is firmly connected mechanically with the table, insures that the desired electrical function will be achieved and solves the above-mentioned mechanical and electrical problems of the conventional approach. The inventive mechanical approach allows for a solution in which no visible/accessible cables are used and in which the interface box is attached to the table in a user-friendly manner. For this purpose, a mechanical construction is provided in the area of the plug panel, by means of which a form-fit connection can be produced with the housing of the interface. Preferably, this can be designed as a rail or trapezoidal guide. The guide mechanism mentioned allows for the adapter (interface box) to be inserted by a sliding movement (in the "–x" direction) into the rail system and thus be fixed in the z and x directions. The interface box is moved to the point that the plug contained in the box comes to be above the socket underneath (at the patient table). By means of a vertical movement (–y direction), the plug of the interface can now be connected with the socket at the table. In the process, besides the electrical contacts formed, a mechanical form-fit fixation in the –z direction is assured. The mechanical integration of an interface box has the advantage of allowing for a mechanically fixed connection with the patient table.

Although modifications and changes may be suggested by those skilled in the art, it is the intention of the inventors to embody within the patent warranted hereon all changes and modifications as reasonably and properly come within the scope of their contribution to the art.

We claim as our invention:

1. An adapter for connecting a local coil of a magnetic resonance data acquisition unit to an acquisition unit component that requires signal transferring communication between said local coil and said acquisition unit component, said adapter comprising:

an adapter body;

a coil-connection element adapter in said adapter body, said coil-connection element adapter having a configuration that forms a signal transferring connection with a coil connection element of said local coil;
an acquisition unit component-connection element adapter in said adapter body, said acquisition unit component-connection element adapter having a configuration that forms a signal transferring connection with an acquisition unit component-connection element of said acquisition unit component;
a fixing element adapted for attachment to said acquisition unit component; and
a housing comprising an adapter body holder having a mechanical configuration that mechanically mates with said fixing element and said adapter body being moveably received in said housing so as to move between a first position in which said adapter body makes no electrical or mechanical contact with said acquisition unit component and a second position in which said adapter body mechanically engages said acquisition unit component to mechanically fix said adapter body to said acquisition unit component, via said fixing element, at a fixed location; and
wherein said adapter body holder being configured to permit movement of said housing with said adapter body received therein along a predetermined direction while mating with said fixing element with said adapter body in said first position.

2. An adapter as claimed in claim 1 wherein said magnetic resonance data acquisition unit comprises a patient table, and wherein said fixing element is a patient table fixing element adapted for attachment on said patient table, and wherein said adapter body holder is configured to mate with said patient table fixing element.

3. An adapter as claimed in claim 1 wherein said adapter body holder comprises a form-fit mechanical connection with said fixing element.

4. An adapter as claimed in claim 1 wherein said acquisition unit component comprises a plug panel comprising at least one socket, and wherein said acquisition unit component-connection element adapter comprises a plug configured for insertion into said socket, and wherein said adapter body is configured to be received at said plug panel.

5. An adapter as claimed in claim 1 wherein said adapter body holder is configured to follow movement of said adapter body along said fixing element to a location, as said fixed location, at which said acquisition unit component-connection element adapter is located opposite said acquisition unit component-connection element of said acquisition unit component, and wherein said housing has a through opening therein which said adapter body a is movable so as to move said acquisition unit component-connection element toward said acquisition unit component to cause said acquisition unit component-connection element adapter to engage and mate with said acquisition unit component-connection element to produce a signal transferring connection therebetween.

6. An adapter as claimed in claim 1 wherein said coil-connection element adapter is configured for detachable insertion and removal of said coil-connection element of said local coil with respect to said coil-connection element adapter.

7. An adapter as claimed in claim 1 wherein said coil-connection element of said local coil is a plug, and wherein said coil-connection element adapter is a socket.

8. An adapter as claimed in claim 1 wherein said coil-connection element of said local coil is a socket, and wherein said coil-connection element adapter is a plug.

9. An adapter as claimed in claim 1 wherein said acquisition unit component-connection element is a plug, and wherein said acquisition unit component-connection element adapter is a socket.

10. An adapter as claimed in claim 1 wherein said acquisition unit component-connection element is a socket, and wherein said acquisition unit component-connection element adapter is a plug.

11. An adapter as claimed in claim 1 wherein said adapter body holder comprises rails formed in said housing, and wherein said fixing element is a rail guide that engages said rails.

12. An adapter as claimed in claim 11 wherein said rail guide has a trapezoidal cross-section.

13. An adapter as claimed in claim 11 wherein said form-fit connection is configured to allow sliding of said housing along said rail guide.

14. An adapter as claimed in claim 13 wherein said rail guide extends in a first direction of a Cartesian coordinate system, and wherein said fixing element is configured to fix said housing with respect to each of second and third directions of said Cartesian coordinate system.

15. A method for connecting a local coil in a magnetic resonance data acquisition unit to an acquisition unit component that requires signal transferring communication between said local coil and said acquisition unit component, comprising the steps of:
providing a coil-connection element adapter in an adapter body, and configuring said coil-connection element adapter to form a signal transferring connection with a coil connection element of said local coil;
providing an acquisition unit component-connection element adapter in said adapter body, and configuring said acquisition unit component-connection element adapter to form a signal transferring connection with an acquisition unit component-connection element of said acquisition unit component;
moveably mounting said adapter body in a housing;
attaching a fixing element to said acquisition unit component;
mechanically mating said housing and said fixing element; to allow movement of said housing in a predetermined direction relative to said fixing element;
mounting said adapter body in said housing to permit moving said adapter body in said housing between a first position in said housing at which said adapter body has no mechanical contact with said acquisition unit component, and a second position at which said adapter body mechanically engages said acquisition unit component to mechanically fix said adapter body to said acquisition unit component, via said fixing element, at a selected location; and
moving said housing, with said adapter body therein in said first position, along said fixing element to said selected location and, with said housing at said selected location, moving said adapter body in said housing from said first position to said second position.

16. A method as claimed in claim 15 wherein the step of mechanically mating said housing and said fixing element comprises mechanically mating said housing and said fixing element to allow sliding of said housing along said fixing element along said predetermined direction.

17. A method as claimed in claim 16 comprising moving said housing in said predetermined direction by sliding said housing with said adapter body therein along said fixing element to said selected location.

* * * * *